(12) United States Patent
Moto

(10) Patent No.: US 8,737,442 B2
(45) Date of Patent: May 27, 2014

(54) DRIVER CIRCUIT FOR LASER DIODE OUTPUTTING PRE-EMPHASIZED SIGNAL

(71) Applicant: Sumitomo Electric Industries, Ltd., Osaka (JP)

(72) Inventor: Akihiro Moto, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/830,085

(22) Filed: Mar. 14, 2013

(65) Prior Publication Data

US 2013/0195133 A1    Aug. 1, 2013

Related U.S. Application Data

(63) Continuation-in-part of application No. 13/689,292, filed on Nov. 29, 2012, which is a continuation-in-part of application No. 13/282,131, filed on Oct. 26, 2011, now Pat. No. 8,571,078.

(30) Foreign Application Priority Data

| Oct. 28, 2010 | (JP) | 2010-242342 |
| Sep. 7, 2011 | (JP) | 2011-194924 |
| Nov. 29, 2011 | (JP) | 2011-260257 |
| Mar. 19, 2012 | (JP) | 2012-062328 |

(51) Int. Cl.
    *H01S 3/00* (2006.01)

(52) U.S. Cl.
    USPC .................... 372/38.02; 372/38.07

(58) Field of Classification Search
    USPC ............................ 372/38.02, 38.07
    See application file for complete search history.

(56) References Cited

U.S. PATENT DOCUMENTS

| 5,546,218 A * | 8/1996 | Komatsubara et al. ........ 359/237 |
| 2011/0164636 A1 * | 7/2011 | Tanaka ........................ 372/38.02 |
| 2011/0268454 A1 * | 11/2011 | Fujita ............................ 398/135 |

FOREIGN PATENT DOCUMENTS

JP    2011-023474 A    2/2011

OTHER PUBLICATIONS

Office Action issued in U.S. Appl. No. 13/282,131 dated May 22, 2013.

* cited by examiner

*Primary Examiner* — Kinam Park
(74) *Attorney, Agent, or Firm* — Venable LLP; Michael A. Sartori; Tamatane J. Aga

(57) ABSTRACT

A shunt driver for driving an LD is disclosed. The shunt driver has the push-pull arrangement with the high side driver and the low side driver. The high side driver is driven by a positive phase signal superposed with a negative phase signal with a delay and a less amplitude with respect to the positive phase signal. The low side driver is driven by a negative phase signal superposed with a positive signal with a delay and a less amplitude compared to the positive phases signal. Adjusting the magnitude of the superposed signals, the driving current for the LD has the peaking in the rising and falling edges thereof.

9 Claims, 13 Drawing Sheets

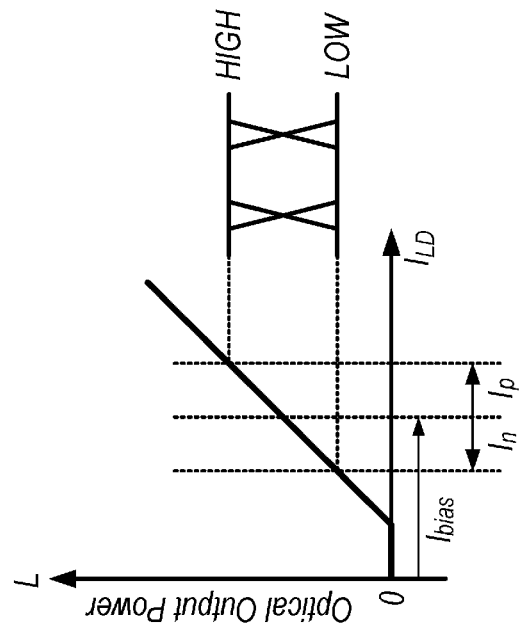
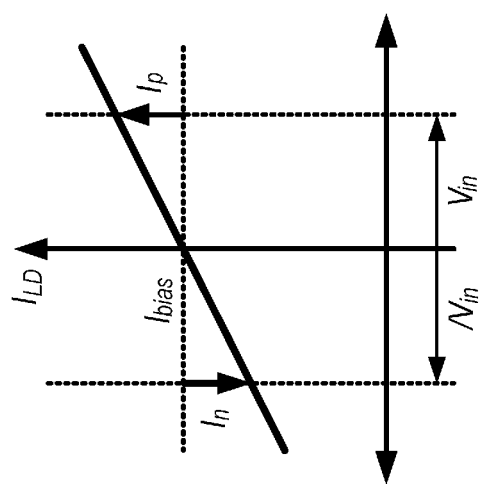
Fig. 2B
Fig. 2A

Fgi. 10A

Fgi. 10B

Fgi. 10C

DRIVER CIRCUIT FOR LASER DIODE OUTPUTTING PRE-EMPHASIZED SIGNAL

CROSS REFERENCE TO RELATED APPLICATIONS

This application is a continuous-in-part of and claims the benefit and priority of U.S. patent application Ser. No. 13/689,292, entitled "SHUNT DRIVER CIRCUIT FOR LASER DIODE WITH PUSH PULL ARCHITECTURE," filed Nov. 29, 2012; which is a continuous-in-part of and claims benefit and priority of U.S. patent application Ser. No. 13/282,131, entitled "LASER DRIVER AND OPTICAL TRANSMITTER IMPLEMENTING THE SAME," filed Oct. 26, 2011. The entire disclosures of each of these applications are hereby incorporated by reference.

BACKGROUND OF THE INVENTION

1. Field of the Invention

The present application relates to a driver for driving a semiconductor laser diode (hereafter denoted as LD).

2. Related Background Arts

A LD driver with, what is called as, the shunt driver has been well known in the field. However, the shunt driver has a subject that it is unavoidable to enhance the trans-conductance. In order to get an enough trans-conductance, the driver has, in an output stage thereof, a MOS transistor with a wider gate width, or a bipolar transistor with a large collector and base size, which inevitably increases parasitic input capacitance and degrades the high frequency performance. The present application is to provide a technique to enhance the high frequency performance of the shut driver for an LD.

SUMMARY OF THE INVENTION

The present application relates to a driver for an LD. The driver, which is driven by a positive phase signal and a negative phase signal, has an arrangement of, what is called, the push-pull driver or shunt driver to provide a push current to the LD or extract a pull current from the LD. The driver includes a positive buffer, a negative buffer, a high side driver, and a low side driver. The positive buffer generates a first positive phase signal and a first negative phase signal from the positive phase signal input to the driver. The negative buffer generates a second positive phase signal and a second negative phase signal from the negative phase signal input to the driver. The high side driver is driven by the first superposed signal including the first positive phase signal superposed with the first negative phase signal with a delay and a less amplitude with respect to the first positive phase signal; while, the low side driver is driven by the second superposed signal including the second negative phase signal superposed with the second positive phase signal with a delay and a less amplitude with respect to the second negative phase signal to generate the pull current extracted from the LD.

The high side driver provides a transistor driven by the first superposed signal, and the low side driver provides a transistor driven by the second superposed signal. The transistors in the high side driver and the low side driver are connected in series between positive and negative power supplies such that the LD is coupled with a node between two transistors. The transistor in the high side driver may be an n-type MOSFET, and the transistor in the low side driver may be an npn-type bipolar transistor.

BRIEF DESCRIPTION OF THE DRAWINGS

Other features and advantages of the present invention will become more apparent from the following detailed description of embodiments herein disclosed by way of example with reference to the attached drawings, in which:

FIG. 2A shows how the superposed current Ibias+Ip and the extracted current Ibias−In are created; and FIG. 2B shows how two optical states, HIGH and LOW, are created by two currents, Ibias+Ip and Ibias−In;

DESCRIPTION OF PREFERRED EMBODIMENTS

Next, some preferred embodiments of the present invention will be described as referring to drawings. In the description of the drawings, numerals or symbols same or similar to each other will refer to elements similar to same to each other without overlapping explanations. An optical transmitter 1 according to an embodiment receives an electrical signal and generates an optical signal corresponding to the electrical signal, which is often called as a transmitter optical subassembly (hereafter denoted as TOSA). The optical transmitter 1 provides a driver 3 with the configuration of, what is called, the push-pull architecture.

Figure 1:
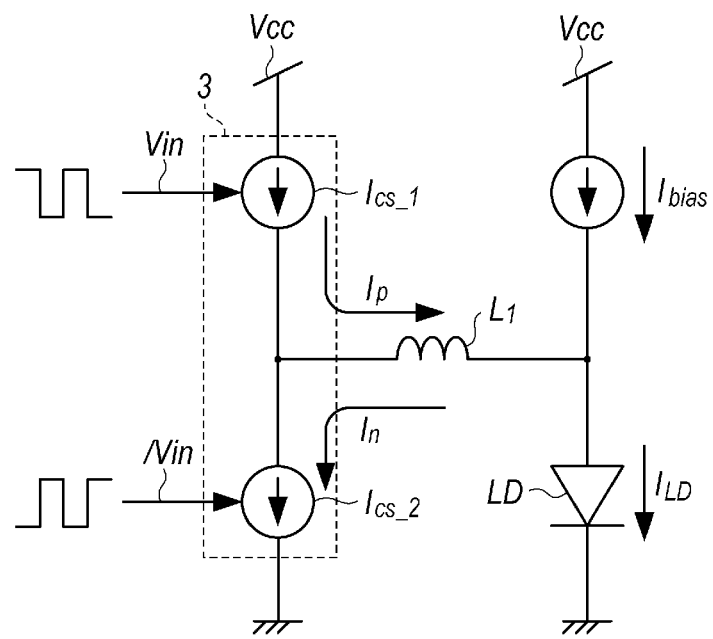
FIG. 1 explains a mechanism of the push pull driver for an LD.

A basic mechanism of the push-pull architecture implemented within the optical transmitter 1 will be first explained by referring to FIG. 1. The optical transmitter 1 includes the driver 3 and a light-emitting device, which is generally an LD. The driver 3 includes a voltage controlled current source $I_{CS\_1}$ and another voltage controlled current source $I_{CS\_2}$. The first current source $I_{CS\_1}$ is put in a side of the positive power supply Vcc; while, the second current source $I_{CS\_2}$ is put in another side of the ground (GND). The LD is supplied with a bias current $I_{bias}$, which is a DC bias, from a current source put outside of the driver 3. The magnitude of the bias current $I_{bias}$ is controlled by an auto power control (hereafter denoted as APC) circuit that determines the average output power of the optical signal output from the LD, which is different from an ordinary driver architecture where a bias current determines the low level of the optical signal. The LD is directly grounded GND in the cathode thereof; while, it is connected in the anode thereof to two current sources, $I_{CS\_1}$ and $I_{CS\_2}$, via a bonding wire $B_1$.

The first current source $I_{CS\_1}$ outputs a current $I_p$, which corresponds to a positive phase signal Vin, to the LD via the bonding wire $B_1$. Here, the term "positive" merely means that the signal has a positive phase relative to the signal with the negative one. The LD, by receiving the positive current $I_P$, becomes active to emit light supplied with a superposed current $I_{bias}+I_p$, which exceeds the bias current $I_{bias}$. The second current source $I_{CS\_2}$, by receiving the negative phase signal /Vin, generates a negative current $I_n$ to extract the bias current $I_{bias}$ from the LD via the bonding wire $B_1$. Then, the LD is driven by an extracted current, $I_{bias}-I_n$ less than the bias current $I_{bias}$. In the description above, the symbol "/" means that a signal denoted thereby has a phase opposite to another signal without this symbol "/".

FIG. 2A shows two states of the LD each driven by the superposed current $I_{bias}+I_p$ and the extracted current $I_{bias}-I_n$. The positive current $I_P$ is modulated by the positive signal Vin; while, the negative current $I_n$ is modulated by the negative signal /Vin, where two signals, Vin and /Vin, have an amplitude same to the others but the phases are opposite to the others.

The operation of the driver 3 will be further described. When the positive signal Vin is in HIGH, which means that the negative signal /Vin is in LOW where the first current source $I_{CS\_1}$ is active but the second current source $I_{CS\_2}$ is inactive, the current $I_p$ flows in the LD via the bonding wire $B_1$; then, the current flowing in the LD becomes the superposed current $I_{bias}+I_p$. On the other hand, when the negative signal /Vin is in HIGH, which means that the positive signal Vin is in LOW, that is, the first current source $I_{CS\_1}$ becomes in active but the second current source $I_{CS\_2}$ is active; the current supplied to the LD is subtracted by the current $I_n$ from the bias current $I_{bias}$. Then, the current flowing in the LD becomes $I_{bias}-I_n$. Thus, the LD is modulated by the signals, Vin and /Vin, complementary to each other between two levels, HIGH and LOW, as shown in FIG. 2B.

Figure 3:
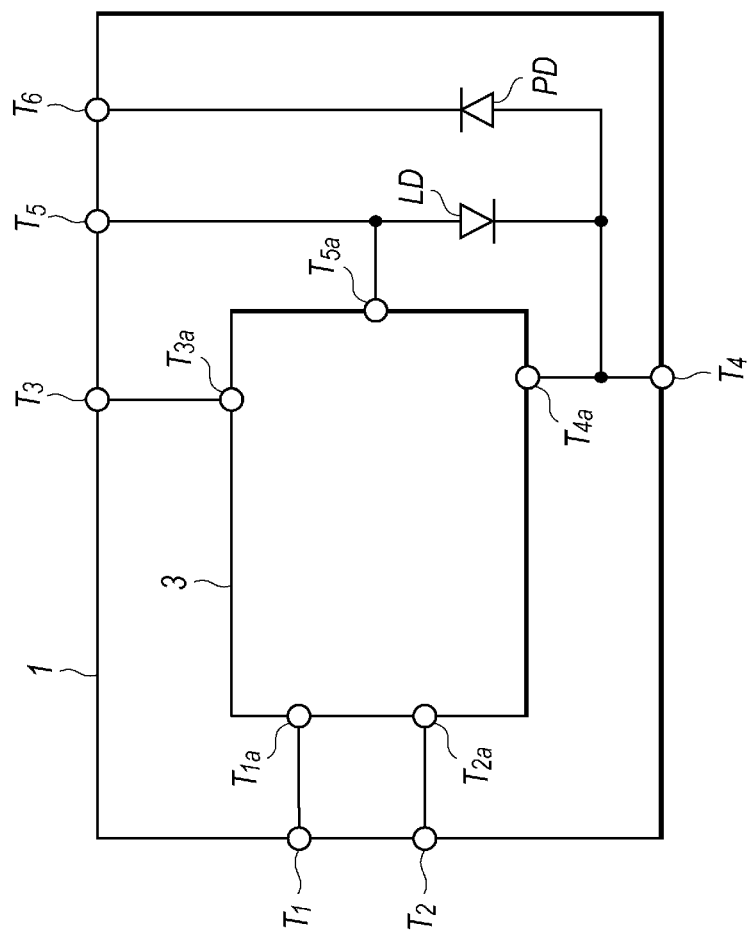
FIG. 3 is a block diagram of an LD driver with the shut drive arrangement.

FIG. 3 is a block diagram of the optical transmitter 1, which includes a driver 3, an LD, and a photodiode (hereafter denoted as PD). The optical transmitter 1 shown in FIG. 3 is a type of the TOSA where whole electrical elements above described, the driver, LD, and PD, are installed within a package of the optical transmitter 1. The driver 3, by receiving driving signals, Vin and /Vin, generates tow currents, $I_p$ and $I_n$, sequentially. The PD monitors portion of light emitted from the LD to operate the APC circuit.

The optical transmitter 1 has terminals, $T_1$ to $T_6$. $T_{wo}$ terminals, $T_1$ and $T_2$ receive the positive and negative signals, Vin and /Vin from an external circuit. The terminal $T_3$ is biased by the power supply Vcc; while, the terminal $T_4$ is grounded. The $T_5$ receives the bias current $I_{bias}$ from the external source via an inductor, which is generally the bonding wire shown in FIG. 1, and the terminal $T_6$ is provided for monitoring the output of the PD to operate the APC circuit. The cathode of the LD is connected not only to the ground in the driver 3 but to the terminal $T_4$, which is connected to the external ground.

The driver 3, which modulates the driving current $I_{LD}$ supplied to the LD responding to the input differential signals, provides terminals, $T_{1a}$ to $T_{3a}$, each connected to corresponding terminals of the optical transmitter 1. Specifically, terminals, $T_{1a}$ and $T_{2a}$, receive the differential signals, Vin and /Vin, respectively. The terminal $T_{3a}$ is provided with the positive power supply Vcc via the terminal $T_3$, $T_{4a}$ is grounded, and $T_{5a}$, which connected to the anode of LD, outputs the current $I_p$ or absorbs another current $I_n$.

The driver 3 includes a high side driver and a low side driver. The high side driver, which is put between the terminals, $T_{1a}$ and $T_{5a}$, provides the push current $I_p$ responding to the positive phase signal Vin. While, the low side driver, which is put between the terminals, $T_{2a}$ and $T_{5a}$, absorbs the extracted current $I_n$ responding to the negative phase signal /Vin. The high side driver includes the first current source $I_{CS\_1}$ and a positive buffer including an emitter follower put in the upstream of the first current source $I_{CS\_1}$. While, the low side driver includes the second current source $I_{CS\_2}$ and a negative buffer including an emitter follower put in the upstream of the second current source $I_{CS\_2}$.

A conventional driver with the arrangement of, what is called, the shunt driver provides one input terminal and one output terminal. The driver 3 according to an embodiment has the architecture of the push-pull type that provides two input terminals, $T_{1a}$ and $T_{2a}$, and the one output terminal $T_{5a}$. $T_{wo}$ input terminals receive the differential signal, which not only doubles the sensitivity of the driver 3 equivalently but inherently has a substantial gain. Accordingly, the driver 3 with the push-pull architecture may be driven by the input signals with smaller magnitude, makes the amplitude of the output current half of the modulation current for the LD, which reduces the power consumption of the driver 3, and is unnecessary to use, for MOS transistors with a long gate width to get a substantial trans-conductance.

First Embodiment

Figure 4:
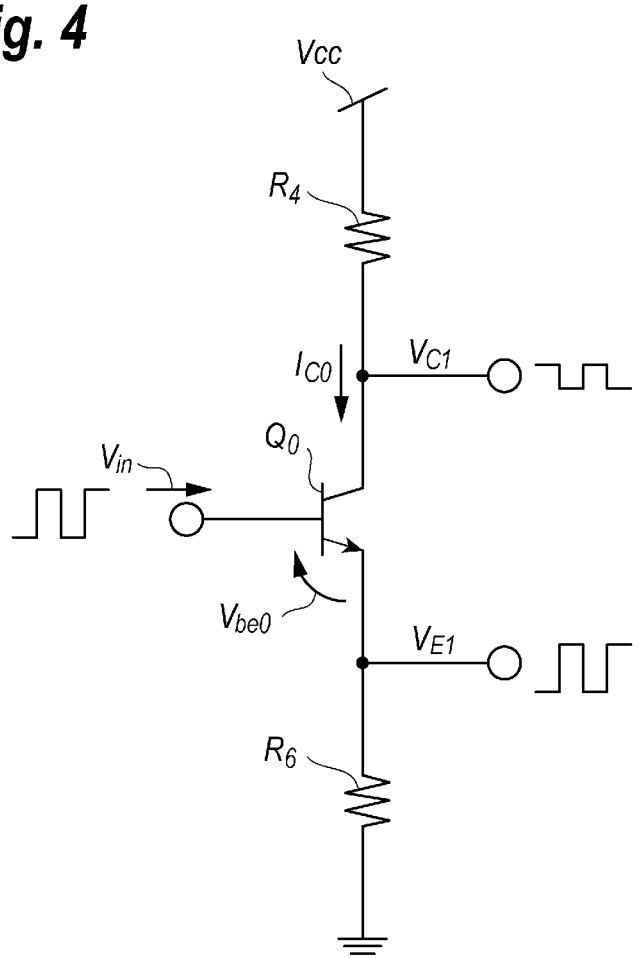
FIG. 4 explains a mechanism to generate two signals with phases opposite to each other by an emitter follower.
Figure 5:
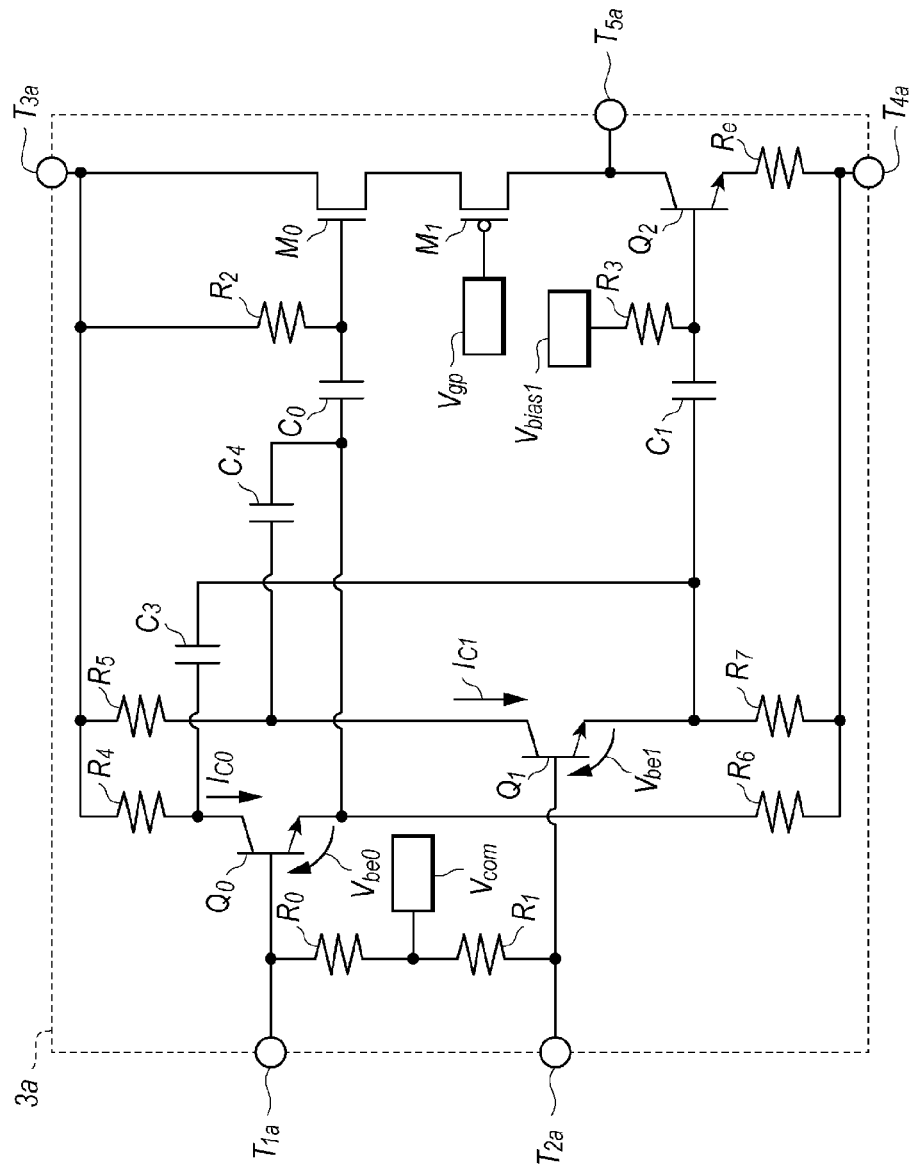
FIG. 5 is a circuit diagram of a driver with the push pull architecture according to an embodiment of the invention.
Figure 6:
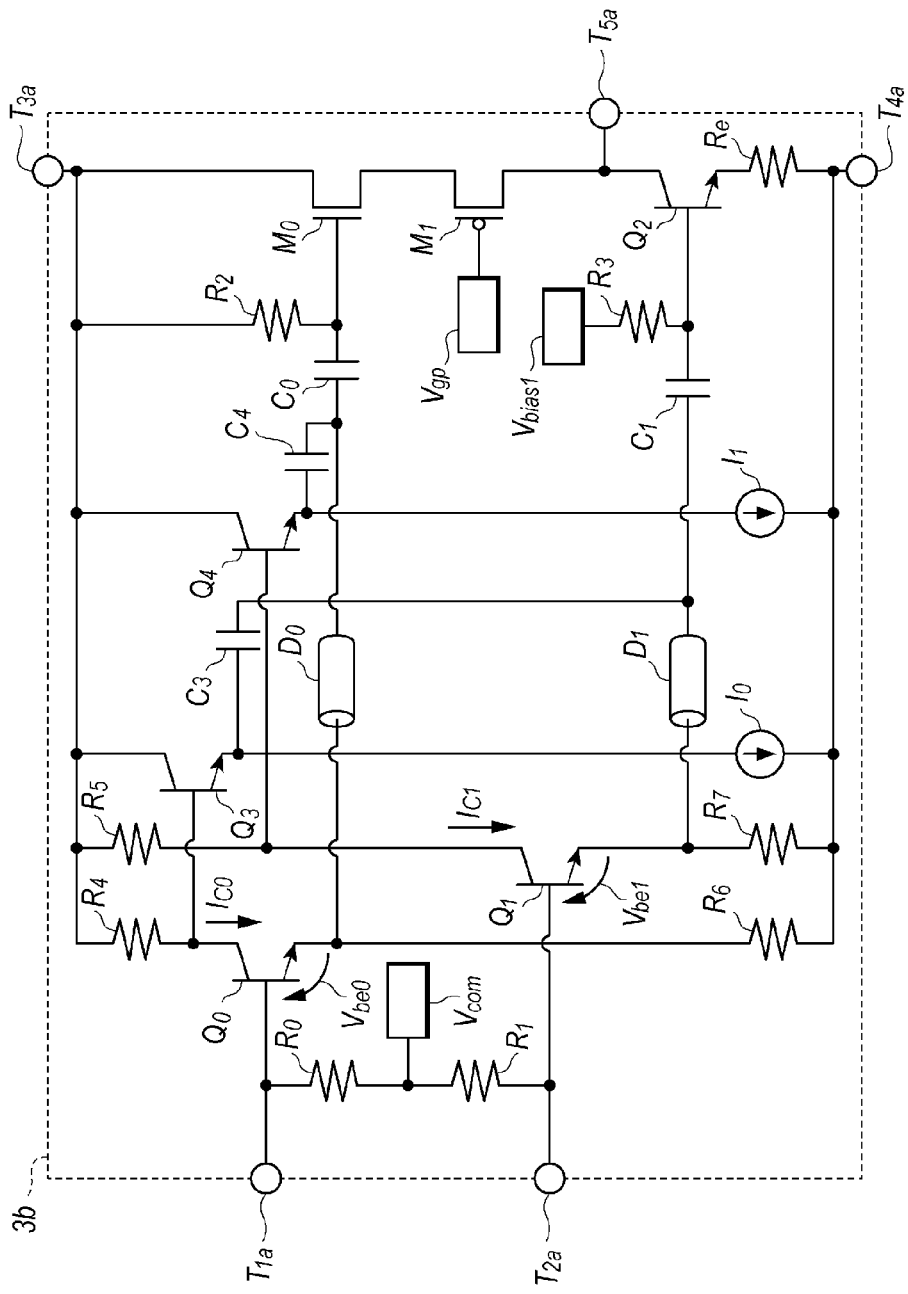
FIG. 6 is a circuit diagram of another driver also with the push pull architecture.

Next, some specific embodiments for the driver 3 will be described. FIGS. 5 and 6 shows circuit diagrams of the driver according to embodiments of the invention; while, FIG. 4 shows a circuit diagram of a modified emitter follower extracted from the positive buffer shown in FIGS. 5 and 6. The emitter follower shown in FIG. 4 is put in the upstream of the push-pull circuit constituted by two current sources, $I_{CS\_1}$ and $I_{CS\_2}$. The emitter follower has an npn-transistor $Q_0$ with the base receiving the input signal, Vin or /Vin, the emitter grounded via a resistor $R_6$, and the collector biased with the power supply Vcc via another resistor $R_6$.

Assuming the base bias current is far less than the collector current, the current coming in the collector, which is the collector current, becomes the current outgoing from the emitter, which is the emitter current. Increasing the base current, both collector and emitter currents increase; then, the collector bias falls but the emitter bias rises because of the collector current flowing in the resistor $R_4$ and the emitter current flowing in the resistor $R_6$. The change of respective biases of the collector and the emitter becomes equal to the others but the phases between them are opposite. That is, the emitter of the transistor $Q_0$ outputs a signal $V_{E1}$ with the positive phase, while, the collector thereof generates another signal $V_{C1}$ with the negative phase. A ratio of the resistance of two resistors, $R_4$ and $R_6$, determined the ratio of the amplitude of two output signals, $V_{C1}$ and $V_{E1}$. That is, an equation below is satisfied:

$$V_{C1}/V_{E1}=R_4/R_6.$$

The driver 3a will be described as referring to FIG. 5. The driver 3a includes resistors, $R_0$ to $R_7$ and $R_e$, capacitors, $C_0$ to $C_4$, and transistors, $Q_0$ to $Q_2$, $M_0$ and $M_1$, where transistors, $Q_0$ to $Q_2$ are npn bipolar transistors, $M_0$ is an n-type MOSFET (Metal-Oxide-Semiconductor Field-Effect-Transistor), and $M_1$ is a p-type MOSFET. The driver 3a further includes bias supplies of $V_{COM}$, $V_{bias1}$ and $V_{gp}$.

The transistor $Q_0$, and two resistors, $R_4$ and $R_6$, constitute a positive buffer with the arrangement shown in FIG. 4. The transistor $Q_1$, two resistors, $R_5$ and $R_7$, constitute a negative buffer with the arrangement shown in FIG. 4. The high side driver, namely, the transistor $M_0$ receives in the gate thereof a positive phase signal from the emitter of transistor $Q_0$ in the positive buffer via the capacitor $C_0$ and from the collector of the transistor $Q_1$ in the negative buffer as a signal with a phase opposite to the negative phase signal via capacitors, $C_4$ and $C_0$. The low side driver, namely, the transistor $Q_2$ receives in the base thereof a negative phase signal from the emitter of the transistor $Q_1$ in the negative buffer via the capacitor $C_1$ and from the collector of the transistor $Q_0$ in the positive buffer via the capacitors, $C_3$ and $C_1$.

The first current source $I_{CS\_1}$ in FIG. 1 includes the transistors, $M_0$ and $M_1$, a resistor $R_2$, and the bias $V_{gp}$. The second current source $I_{CS\_2}$ in FIG. 1 includes the transistor $Q_2$, resistors, $R_3$ and Re. and the bias $V_{bias1}$.

In the transistor $Q_0$, the base thereof receives the positive input signal Vin from the terminal $T_{1a}$, the collector being biased by the power supply from the terminal $T_{3a}$ via the resistor $R_4$, and the emitter being grounded by the terminal $T_{4a}$ via the resistor $R_6$. Moreover, the collector of the transistor $Q_0$ is coupled in AC mode via the capacitors, $C_3$ and $C_1$, with the base of the transistor $Q_2$ in the low side driver; while, the emitter thereof is coupled in AC mode via the capacitor $C_0$ with the transistor $M_0$ in the high side driver. In the transistor $Q_1$, the base receives the negating phase input signal /Vin from the terminal $T_{2a}$, the collector being biased by the positive power supply from the terminal $T_{3a}$ via the load resistor $R_5$, and the emitter being grounded by the terminal $T_{4a}$ via the resistor $R_7$. Moreover, the collector of the transistor $Q_1$ is coupled in AC mode via the capacitors, $C_4$ and $C_0$, with the transistor $M_0$ in the high side driver, and the emitter thereof is coupled in AC mode via the capacitor $C_1$ with the transistor $Q_2$ in the low side driver. $T_{wo}$ resistors, $R_0$ and $R_1$, not only terminate the input terminals, $T_{1a}$ and $T_{2a}$, but set the bias level to them by the bias source $V_{com}$.

Because the collector currents, $I_{C0}$ and $I_{C1}$, of the transistors, $Q_0$ and $Q_1$, are determined as:

$$I_{C0}=(V_{com}-Vbe_0)/R_6$$

$$I_{C1}=(V_{com}-Vbe_1)/R_7,$$

the bias $V_{com}$ is determined to flow a preset collector current, $I_{C0}$ and $I_{C1}$, in respective transistors, $Q_0$ and $Q_1$, where Vbe is the base-emitter bias of a bipolar transistor and ordinarily given by a forward bias voltage of a p-n junction diode. For instance, setting Vbe, resistance of resistors, and the preset collector current are 0.8 V, 200Ω, and 4 mA, respectively, the bias $V_{com}$ is determined to be 1.6 V.

Transistors, $M_0$, $M_1$ and $Q_2$ are connected in series between two terminals, $T_{3a}$ and $T_{4a}$. Among them, the MOSFETs, $M_0$ and $M_1$, operate as the push transistors, while, the bipolar transistor $Q_2$ operates as the pull transistor. The transistor $M_0$ coupled with the emitter of the transistor $Q_0$ via the capacitor $C_0$ and the collector of the transistor $Q_1$ via the capacitors, $C_0$ and $C_4$. The gate of the transistor $M_0$ is biased by the power supply Vcc via the terminal $T_{3a}$ and the resistor $R_2$. The transistor $M_1$ is biased by the bias Vgp in the gate thereof. The transistor $Q_2$ in the base thereof is coupled with the emitter of the transistor $Q_1$ via the capacitor $C_1$, also with the collector of the transistor $Q_0$ via the capacitors, $C_3$ and $C_1$. The base of the transistor $Q_2$ is biased by $V_{bias1}$ via the resistor $R_3$.

Although the transistors, $M_0$, $M_1$ and $Q_2$, in the high side driver and the low side driver are necessary to be large in the size thereof to drive the LD or to flow a large current therein, which inevitably increase junction capacitance, namely Cgs and Cgd for a MOSFET, while Cbe and Cbc for a bipolar transistor; the emitter follower constituted by the transistors, $Q_0$ and $Q_1$, enhances the capability to driver those transistors. Then the input terminals, $T_{1a}$ and $T_{2a}$, may be isolated from such large transistors, and the high frequency performance of the driver 3a is maintained.

Moreover, the transistors, $M_0$ and $Q_2$, are doubly driven by the input signal. That is, the transistor $M_0$ in the high side driver is driven by the positive phase signal Vin via the transistor $Q_0$ and also by the negative phase signal /Vin reversed in a phase thereof via the transistor $Q_1$. Thus, the driving signal applied to the gate of the transistor $M_0$ is doubled. Similarly, the transistor $Q_2$ is driven by the negative phase signal /Vin via the transistor $Q_1$, concurrently by the positive phase signal Vin reversed in the phase thereof via the transistor $Q_0$. Thus, both the high side driver $M_0$ and the low side driver $Q_2$ are doubly driven by positive and negative phase signals, which enhance the high frequency performance of the driver 3a.

Transistors, $M_0$, $M_1$, and $Q_2$, in the high side and low side drivers are biased individually by bias supplies, namely, the positive power supply Vcc for the transistor $M_0$, the bias Vgp for the transistor $M_1$, and another bias $V_{bias1}$ for the transistor $Q_2$, at respective optimum conditions. Moreover, both the high side driver $M_0$ and the low side driver $Q_2$ are driven by the transistors, $Q_0$ and $Q_1$, in AC mode via capacitors. Accordingly, the gate, or the base of the drivers are optionally set in their optimum operating points.

The resistance of the resistors, $R_2$ and $R_3$, coupled with the gate and the base of the driving transistors, $M_0$ and $Q_2$, are preferably large enough. Coupling capacitors, $C_0$ to $C_4$, monolithically formed with active elements, $Q_0$ to $Q_2$ and $M_0$ to $M_1$, are restricted in the capacitance thereof. On the other hand, the resistors, $R_2$ and $R_3$, each form a low-cut filter with a cut-off frequency determined by the resistance and the capacitance. The driver 3a, when it is used in the optical communication system, is necessary for the cut-off frequency to be smaller than 100 kHz. Accordingly, to obtain such a cut-off frequency, the resistors, $R_2$ and $R_3$ are preferably to be greater than 100 kΩ, or further preferably greater than 1 MΩ.

Furthermore, the capacitor $C_0$ and the resistor $R_2$ constitute a differential circuit; while, the capacitors, $C_4$ and $C_0$, and a resistor $R_2$ constitute a differential circuit. Setting the cut-off frequency of the latter differential circuit far higher than that of the former differential circuit, that is, the capacitance of the capacitor $C_4$ is far smaller than that of the capacitance $C_0$, the signal coming from the transistor $Q_1$ becomes positive and negative pulses each appearing in the rising and falling edges of the signal via the transistor $Q_0$. This enhances the high frequency response of the MOSFET $M_0$. Similarly, the contribution of a signal coming from the collector of the transistor $Q_0$ to the base of the pull transistor $Q_2$ is restricted by setting the capacitance of the capacitor $C_3$ far less than that of the capacitor $C_1$, only the rising and falling edges of the negative phase signal supplied to the base of the transistor $Q_2$ may be enhanced.

The transistor $M_1$ has a conduction type opposite to the transistor $M_0$. In the present embodiment, the transistor $M_1$ is a p-MOSFET with the gate biased by $V_{gp}$. Because the source thereof is connected with the source of the transistor $M_0$, which means that the output of the driver 3a is brought from the drain of the transistor $M_1$. Thus, the output impedance of the high side driver is relatively large. In a case where the source of the transistor $M_0$ is coupled directly with the transistor $Q_2$, the transistor $Q_2$ is likely to pull the current from the high side driver not from LD because the source impedance is comparably low.

The driver $3a$, because it provides the emitter follower in upstream of the push-pull circuit, inherently shows the power consumption higher than a driver with the type of, what is called, the shunt driver. However, the push-pull architecture, as already described, lowers the bias current $I_{bias}$ supplied to the LD half of conventional shunt driver. Accordingly, the power consumption of the optical transmitter 1 resultantly becomes comparative to conventional optical transmitters.

The driver $3a$ provides, in the input ports, $T_{1a}$ and $T_{2a}$, thereof, a differential termination, that is, two termination resistors, R0 and R1, are connected between two input ports in series and the intermediate node of two resistors, $R_0$ and $R_1$, is biased by $V_{com}$. However, respective input ports, $T_{1a}$ and $T_{2a}$, are independently biased via a termination resistor.

Second Embodiment

Next, another driver $3b$ according to the second embodiment of the present invention will be described as referring to FIG. 6. The driver $3b$ includes, in addition to those of the aforementioned driver $3a$, two emitter followers, one of which is comprised of a transistor $Q_3$ and a current source $I_0$, while, the other is comprised of a transistor $Q_4$ and a current source; and two delay lines, $D_0$ and $D_1$. The former emitter follower, which is called as the high side emitter follower, is in downstream of the transistor $Q_0$ processing the positive phase signal Vin, while, the latter emitter follower, which is called as the low side emitter follower, is in downstream of the transistor $Q_1$ that processes the negative phase signal /Vin. These two emitter followers can stabilize the operation of two transistors, $Q_0$ and $Q_1$.

For instance, in a case where the driver $3b$ removes these two emitter followers, the collector of the transistor $Q_0$ may be influenced by the resistors, $R_7$ and $R_3$, and the emitter of the transistor $Q_1$ via the coupling capacitor $C_3$. Also, the collector of the transistor $Q_1$ may be influenced by the resistors, $R_6$ and $R_2$, and the emitter of the transistor $Q_0$. Putting the emitter followers in the downstream of the collector of the transistors, $Q_0$ and $Q_1$; the collector may be isolated from the emitter of the other transistor. The delay lines compensate the delay caused by the insertion of the emitter followers.

Figure 7:
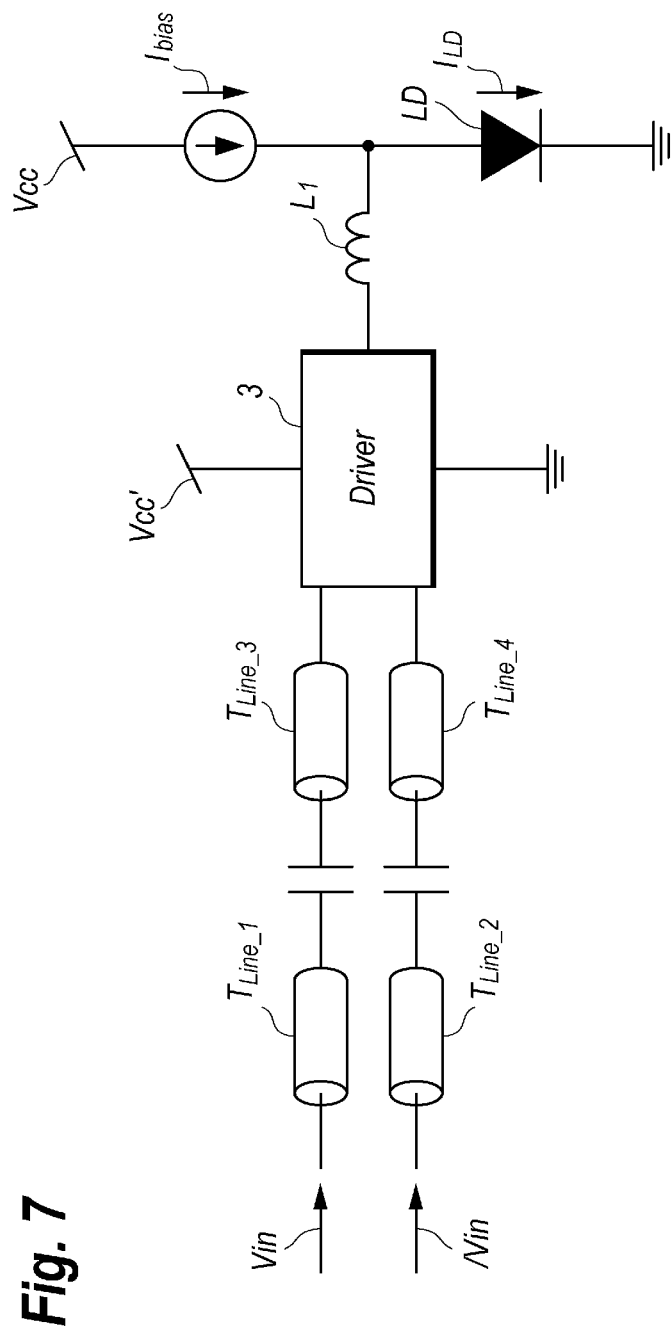
FIG. 7 is a block diagram of a setup to evaluate the frequency dependence of driving current $I_{LD}$ for an LD.
Figure 8:
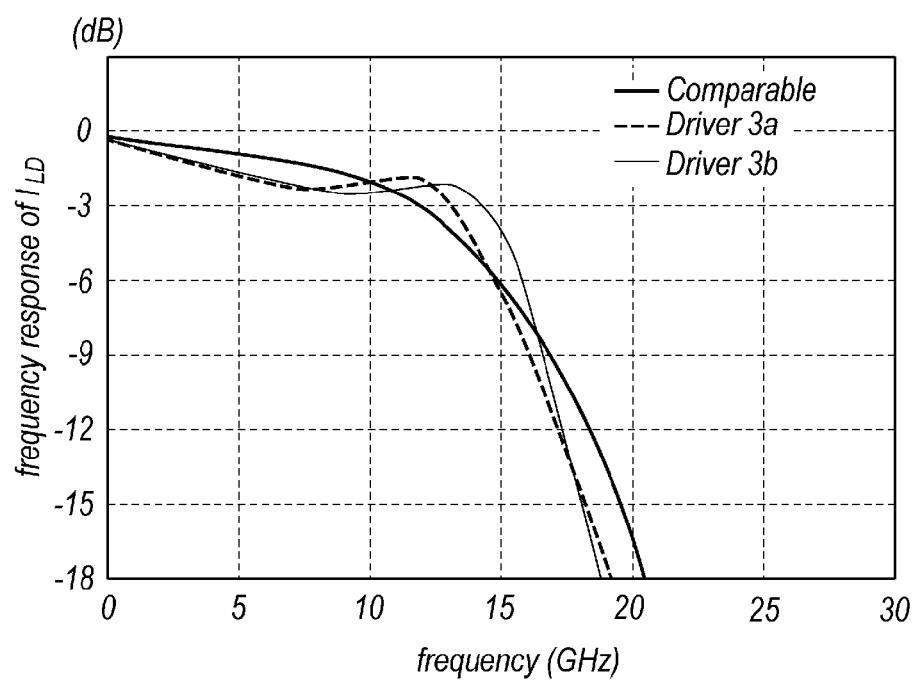
FIG. 8 compares the frequency response of the driving current $I_{LD}$ of the drivers according to embodiments of the invention with a comparative driver without buffers for driving the push pull circuit.

Next, frequency characteristics of the driving current $I_LD$ is evaluated by a circuit shown in FIG. 7, where the circuit includes four transmission lines, $T_{Line\_1}$ to $T_{Line\_4}$, the driver 3, and the bias current source $I_{bias}$. The transmission lines, $T_{Line\_1}$ to $T_{Line\_4}$, show transmission loss of about 0.5 dB at 20 GHz. Two signals, Vin and /Vin, which show sinusoidal shape, are input to the driver via the transmission lines, $T_{Line\_1}$ to $T_{Line\_4}$. The driver 3, responding to two signals, Vin and /Vin, generates the currents, $I_p$ and $I_n$, to modulate the driving current $I_LD$. FIG. 8 compares the frequency dependence of the driving current $I_LD$ for various drivers. In FIG. 8, the behavior for the comparative driver has an arrangement that the transistor $M_0$ in the high side driver is driven by only the emitter of the transistor $Q_0$ via the capacitor $C_0$ and the transistor $Q_2$ in the low side driver is driver by only the emitter of the transistor $Q_1$. In the driver $3a$, resistors, $R_4$ and $R_5$, has resistance of 50Ω, capacitors, $C_3$ and $C_4$, has capacitance of 300 fF. In the driver $3b$, resistors, $R_4$ and $R_5$, has resistance of 60Ω and capacitors, $C_3$ and $C_4$, has capacitance of 140 fF, and two delay lines, $D_0$ and $D_1$, have a delay of 2 pS. The frequency bandwidth of the comparative driver is 11.86 GHz, while, that of the driver $3a$ is 13.11 GHz, and that of the other driver $3b$ is 14.23 GHz. Thus, the drivers, $3a$ and $3b$, according to embodiments of the invention may widen the frequency bandwidth the driving current $I_{LD}$ by 1.3 to 2.4 GHz.

The optical transmitter 1 thus described provides the driver 3 with the push-pull architecture driven to generate the driving current $I_{LD}$. The push-pull driver, because it is driven by the differential signal, the amplitude of the modulation signal and the power consumption may be suppressed; accordingly, the EMI (electro-magnetic interference) tolerance is reduced and the frequency bandwidth is widened. The trans-conductance (mA/V) of the driver can be enhanced without increasing the trans-conductance of the low side driver (the pull side driver); namely, without the degradation of the frequency bandwidth. Moreover, the high side driver (the push side driver) may enhance the trans-conductance of the driver, which can set the amplitude of the input signals relatively small. Accordingly, the EMI tolerance is suppressed, the high frequency response is enhanced, and the total power consumption is lowered.

Both the high side driver and the lower side driver may be complementarily driven, that is, the high side driver may be driven by the positive phase signal superposed with a signal with a phase opposite to the negative phase signal; while, the low side driver may be driven by the negative phase signal superposed with a signal with a phase opposite to the positive phase signal. Then, the driving signal applied to the high side driver and the low side driver may have a peaking to strengthen rising and falling edges.

Third Embodiment

Figure 9:
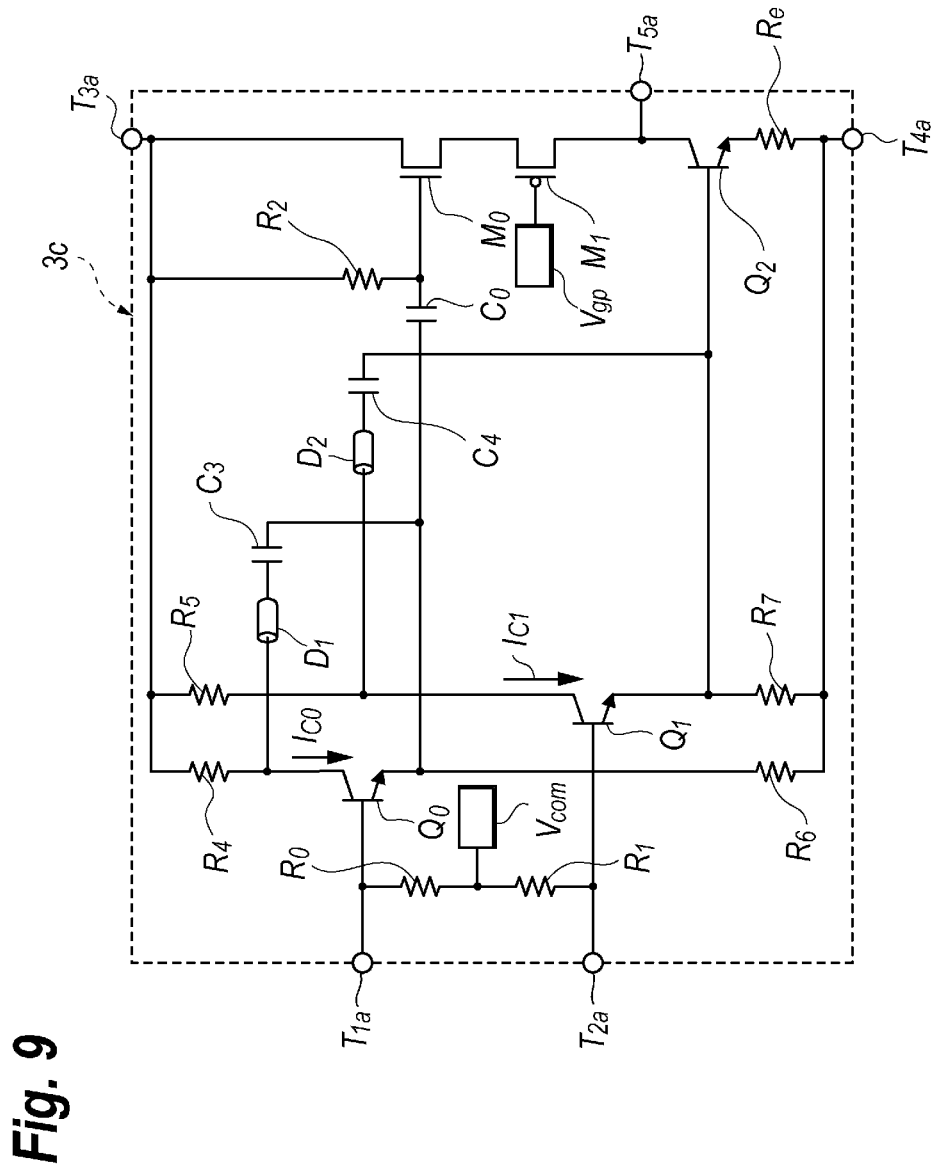
FIG. 9 is a circuit diagram of a driver according to still another embodiment of the present invention.

FIG. 9 shows a circuit diagram of a driver according to still another embodiment of the present invention. The driver $3c$ shown in FIG. 9 has an arrangement similar to those of aforementioned embodiment. That is, the driver includes two transistors, $Q_0$ and $Q_1$, each operated primarily as an emitter follower and the push-pull driver constituted by two MOSFETs, $M_0$ and $M_1$, and a bipolar transistor $Q_2$. A feature of the present embodiment is that the arrangement of the emitter follower, $Q_0$ and $Q_1$, namely, the positive buffer and the negative buffer, are modified from the aforementioned embodiment.

The transistor $Q_0$, which constitutes the positive buffer, receives the positive phase signal Vin in the base thereof, the emitter thereof is coupled with the terminal through the resistor $R_6$, and the collector is coupled with the other terminal T3a through the resistor $R_4$. The same arrangement is shown in the other emitter follower $Q_1$, which constitutes the negative buffer. One of features of the emitter follower, $Q_0$ and $Q_1$, is that the resistor, $R_6$ or $R_7$, connected to respective emitter has resistance greater than that of the resistor, $R_4$ or $R_5$, connected in respective collectors.

Generally, a transistor reverses the phase of a signal input to the base thereof when the output is taken at the collector, while, a transistor maintains the phase of the signal when the output is taken at the emitter. In other words, the signal output from the collector has a phase opposite to that output from the emitter. Moreover, an amplitude of the signals appeared in the collector and the emitter is proportional to the value of the load connected to the collector and the emitter, respectively.

Referring to FIG. 9 again, another feature of the driver $3c$ is that, concentrating on the transistor $Q_0$, the collector thereof is coupled with the emitter through a delay element $D_1$ and a capacitor $C_3$ connected in series to the delay element $D_1$. The collector and the emitter of the transistor, $Q_0$ and $Q_1$ are coupled to each other as interposing respective delay elements, $D_1$ and $D_2$. The capacitor, $C_3$ and $C_4$, are for cutting the DC component, and passes only AC components of the signal. The delay elements, $D_1$ and $D_2$, are the substantial circuit element of the emitter follower of the driver 3c. For the transistor $Q_0$, which passes the positive phase signal Vin provided to the terminal T1a to the high side driver $M_0$, the positive phase signal output from the emitter thereof is superposed with a negative phase signal output from the collector thereof with some delays and a less amplitude.

The same situation is applicable to the other emitter follower transistor $Q_1$. That is, the transistor $Q_1$ receives the negative phase signal /Vin from the terminal T2a and provides the negative phase signal from the emitter thereof to the low side driver $Q_2$ superposed with the positive phase signal output from the collector thereof with some delays determined by the delay element $D_2$ and a less amplitude.

Figure 10:
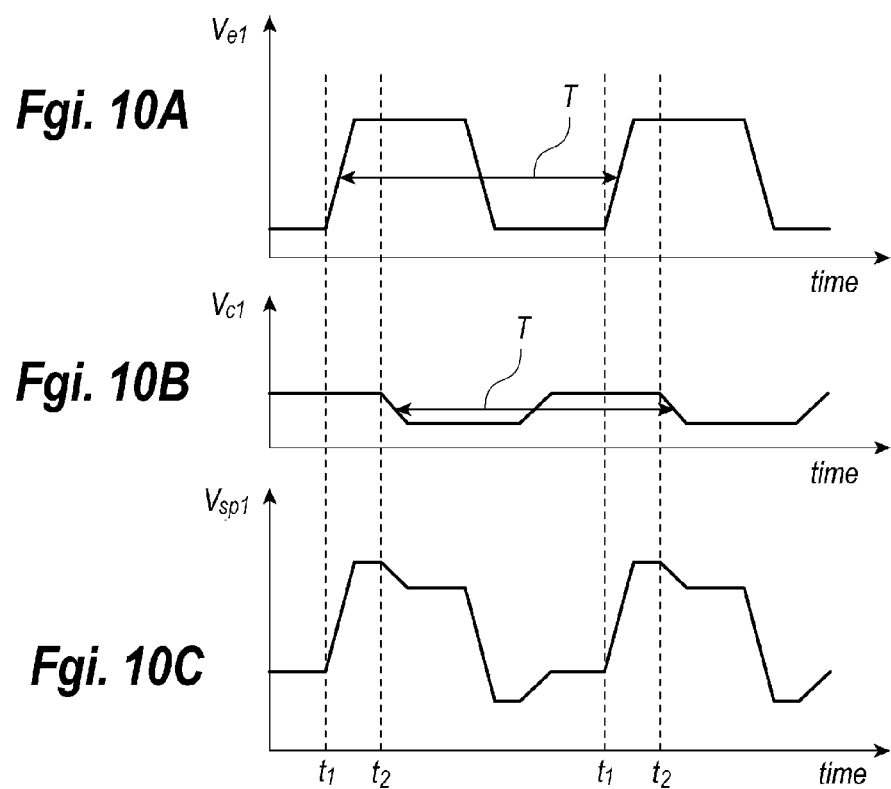
FIG. 10A shows a signal output from the emitter of a transistor.
FIG. 10B shows a signal output from the collector of the transistor and delayed by a delay element.
FIG. 10C shows signal shown in FIG. 10A superposed with the signal shown in FIG. 10B.

Next, the operation of the driver 3c will be described. FIGS. 10A to 10C show time charts of the signals output from the emitter, that from the collector, and the signal superposing those two signals shown in FIGS. 10A and 10B. As shown in FIG. 10A, the signal output from the emitter rises at a time t1, while the signal output from the collector falls at a time t2 delayed by τ from t1. The delay τ is less than a half of the period T of the signal Vin. Superposing the signal shown in FIG. 10B with that shown in FIG. 10A, the superposed signal shown in FIG. 10C is obtained. The superposed signal shown in 10C shows an overshoot after the rising and an undershoot subsequent to the falling; that is, the rising and the falling edges of the signal are pre-emphasized. The superposed signal shown in FIG. 10C, which is attributed with the overshoot and the undershoot is provided to the low side driver $Q_2$ and to the high side driver $M_0$ as reversing the phase thereof by 180°.

An LD is generally regarded as an inductive device for the rising of the optical output, but a capacitive device for the falling of the optical output.

That is, the light output from an LD generally shows a fast rising with subsequent some ringing and a moderate falling with substantially no ringing. The driver 3c of the present embodiment, in particular, the push-pull driver including transistors, $M_0$, $M_1$, and $Q_2$, driven by signals with the overshoot and the undershoot as those shown in FIG. 3; may provide the driving signal to such an LD having the steep rising and falling. The steep rising of the signal provided to the low side driver $Q_2$ may accelerate to pull the driving current out from the LD.

Figure 11:
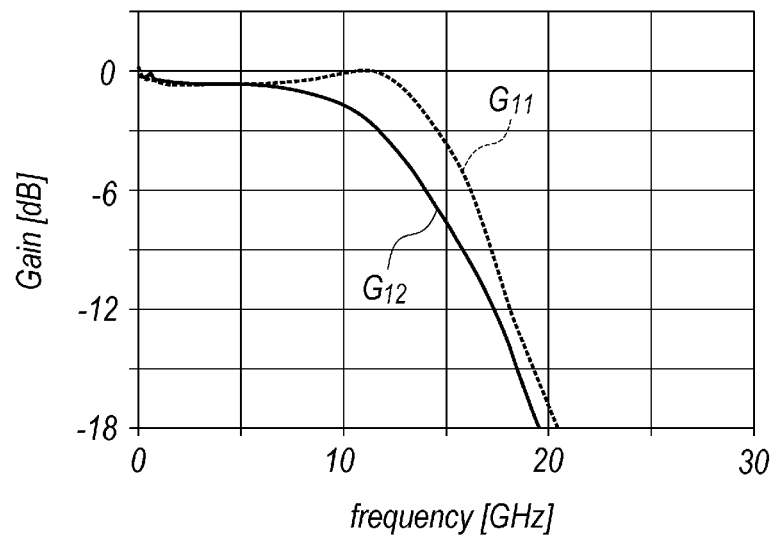
FIG. 11 compares the frequency response of the driver shown in FIG. 9 with a conventional driver without any pre-emphasis.

FIG. 11 compares the driver 3c with a conventional driver by the frequency response. The conventional driver has no function to accelerate the rising and the falling of the output signal. The behavior G11 is the frequency response of the driver 3c of the present embodiment, while, the other behavior G12 shows a response for a conventional driver without any superposed function. As shown in FIG. 11, the behavior G11 extends the cut-off frequency, which is measured at a point at which the frequency response decreases by −3 dB with respect to low frequencies, by about 2.6 GHz compared with that of the conventional driver. Thus, the driver 3c of the present embodiment may drive an LD with further accelerated rate.

Fourth Embodiment

Figure 12:
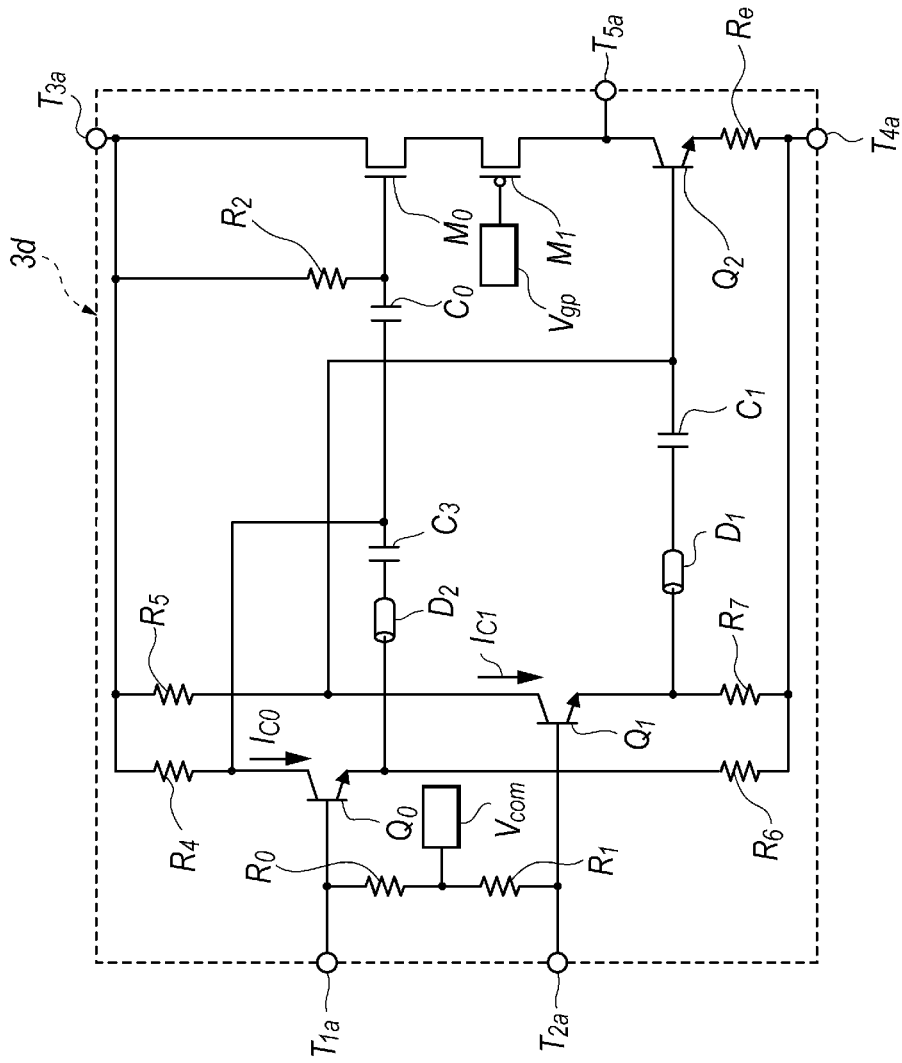
FIG. 12 is a circuit diagram of a driver modified from the driver shown in FIG. 9.

FIG. 12 is a circuit diagram of a driver 3d according to still another embodiment of the invention.

The driver 3d has a feature distinguishable from the aforementioned driver that the delay element, $D_1$ and $D_2$, is coupled with the emitter of the transistors, $Q_0$ and $Q_1$, instead of the collector thereof.

An operation of the driver 3d will be described.

Different from the aforementioned driver 3c, the transistor $Q_0$ coupled with the terminal T1a receives the negative phase signal /Vin; while, the other transistor $Q_1$ coupled with the terminal T2a receives the positive phase signal Vin. Then, the positive phase signal output from the emitter of the transistor $Q_1$ is superposed with the negative phase signal output from the collector with a delay caused by the delay element $D_1$ and a less amplitude. The superposed signal is provided to the low side driver $Q_2$. When this superposed signal is in HIGH; the low side driver $Q_2$ turns on to operate as a pull-driver for the LD to extract the current flowing in the LD quickly because the superposed signal accompanies with some overshoots and undershoots.

Also, the negative phase signal output from the emitter of the transistor $Q_0$ is superposed with the positive phase signal output from the collector thereof accompanied with the delay and a less amplitude determined by a ratio of the resistance of the resistors, $R_4$ and $R_5$. This superposed signal is provided to the high side driver $M_0$, which also accelerates the turn-on and turn-off of the high side driver $M_0$.

Fifth Embodiment

Figure 13:
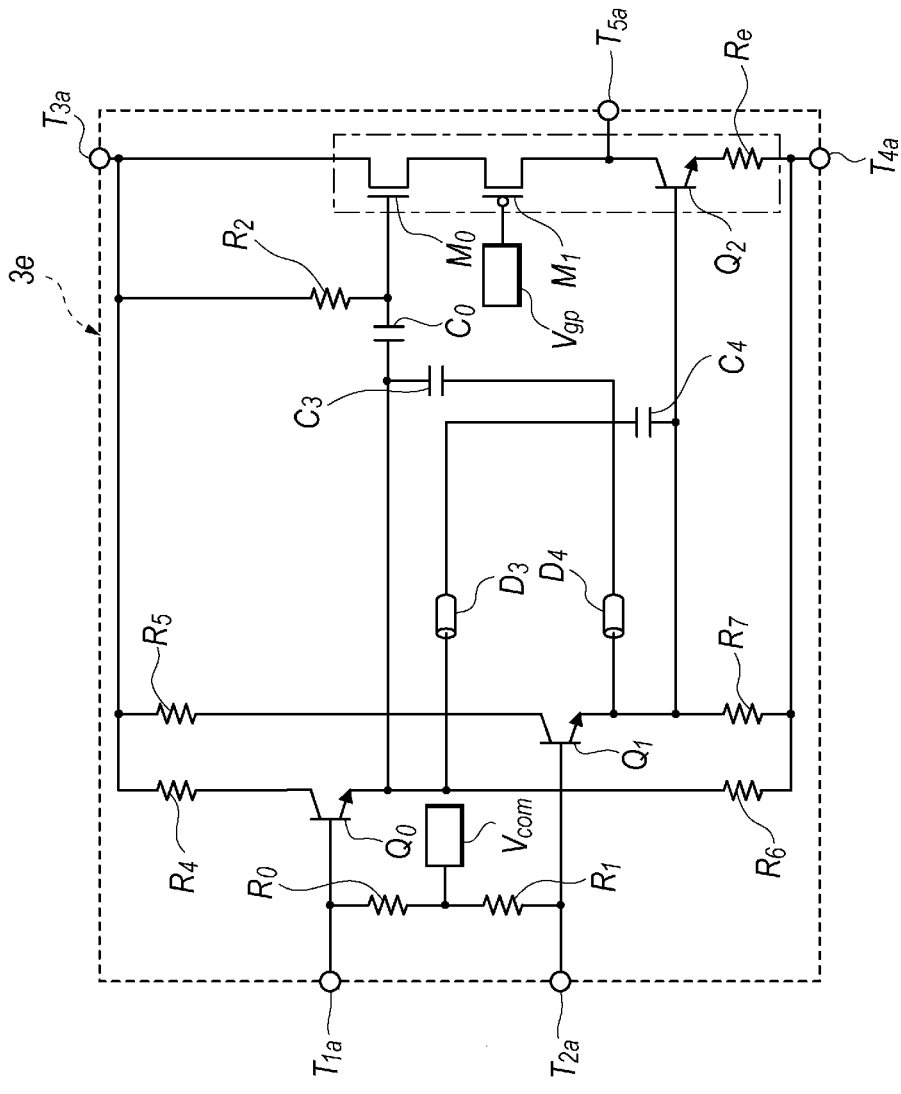
FIG. 13 is a circuit diagram of a driver also modified from the driver shown in FIG. 9.

FIG. 13 shows a circuit diagram of a driver 3e according to still another embodiment of the invention. The driver 3d has a feature distinguishable from aforementioned drivers, 3c and 3d, that a signal to be superposed is brought from the other transistor, $Q_0$ or $Q_1$.

That is, the positive phase signal Vin provided to the terminal T2a passes through the transistor $Q_1$ to be output from the emitter thereof. This signal is superposed with the positive phase signal output from the emitter of the other transistor $Q_0$ with some delays caused by the delay element $D_3$. A situation similar to those above described is appeared in the negative phase signal. That is, the negative phase signal output from the emitter of the transistor $Q_0$ is superposed with the positive phase signal output from the emitter of the other transistor $Q_1$ with the delay caused by the delay element $D_4$. The low side driver $Q_2$ receives the superposed signal from the transistor $Q_1$; while, the high side driver $M_0$ receives the negative phase signal superposed with the positive phase signal from the emitter of the transistor $Q_0$. Even in the driver 3e, the low side driver $Q_2$ may be driven by the positive phase signal superposed with the negative phase signal with a delay and a less amplitude, while, the high side driver $M_0$ is driven by the negative phase signal superposed with the positive phase signal with a delay and a less amplitude. Thus, the driver 3e may accelerate the operation of the LD.

While certain embodiments of the present invention have been illustrated with reference to specific combinations of elements, various other combinations may also be provided without departing from the teachings of the present invention. Thus, the present invention should not be construed as being limited to the particular exemplary embodiments described herein and illustrated in the figures, but may also encompass combinations of elements of the various embodiments.

What is claimed is:

1. A driver for providing a push current to a semiconductor laser diode (LD) and extracting a pull current from the LD, the driver being driven by a differential signal including a positive phase signal and a negative phase signal, comprising:
    a positive buffer configured to generate a first positive phase signal and a first negative phase signal from the positive phase signal;
    a negative buffer configured to generate a second positive phase signal and a second negative phase signal from the negative phase signal;
    a high side driver for generating the push current supplied to the LD, the high side driver being driven by a first superposed signal including the first positive phase signal superposed with the first negative phase signal with a delay with respect to the first positive phase signal; and a low side driver for generating the pull current extracted from the LD, the low side driver being driven by a second superposed signal including the second negative phase signal superposed with the second positive phase signal with a delay with respect to the second negative phase signal.

2. The driver of claim 1,
wherein the high side driver provides a push transistor driven by the first superposed signal, and the low side driver provides a pull transistor driven by the second superposed signal, the push transistor and the pull transistor being connected in series between a power supply and a ground, and
wherein the LD is coupled with a node between two transistors.

3. The driver of claim 2,
wherein the push transistor in the high side driver is an n-type MOSFET and the pull transistor in the low side driver is an npn-type bipolar transistor.

4. The driver of claim 3,
wherein the high side driver further includes a p-type MOSFET between the n-type MOSFET and the node, and
wherein the push current is provided from a drain of the p-type MOSFET.

5. The driver of claim 4,
wherein the n-type MOSFET, the p-type MOSFET, and the npn-type bipolar transistor are individually biased.

6. The driver of claim 1,
wherein the positive buffer includes a bipolar transistor with a base receiving the positive phase signal, an emitter outputting the first positive phase signal, and a collector outputting the first negative phase signal, and
wherein the negating buffer includes another bipolar transistor with a base receiving the negative phase signal, an emitter outputting the second negative phase signal, and a collector outputting the second positive phase signal.

7. The driver of claim 6,
wherein the first positive phase signal has an amplitude greater than an amplitude of the first negative phase signal, and the second negative phase signal has an amplitude greater than an amplitude of the second positive phase signal.

8. The driver of claim 6,
wherein the collector and the emitter of the transistor in the positive buffer are coupled with a positive power supply and a negative power supply through a resistor, respectively, and the collector and the emitter of the transistor in the negative buffer are coupled with the positive power supply and the negative power supply through a resistor, respectively,
wherein the resistors coupled with the emitter of the transistor in the positive buffer and the emitter of the transistor in the negative buffer have resistance greater than resistance of the resistors coupled with the collector of the transistor in the positive buffer and the collector of the transistor in the negative buffer, respectively.

9. The driver of claim 1,
wherein the push current and the pull current provided from the driver are pre-emphasized in a rising edge and a falling edge thereof.

* * * * *